(12) United States Patent
Chu et al.

(10) Patent No.: US 6,242,358 B1
(45) Date of Patent: Jun. 5, 2001

(54) METHOD FOR ETCHING METAL FILM CONTAINING ALUMINUM AND METHOD FOR FORMING INTERCONNECTION LINE OF SEMICONDUCTOR DEVICE USING THE SAME

(75) Inventors: Gang-soo Chu; Dong-yun Kim, both of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/184,855

(22) Filed: Nov. 3, 1998

(30) Foreign Application Priority Data

Dec. 11, 1997  (KR) .................................................. 97-67744

(51) Int. Cl.[7] ...................... H01L 21/302; H01L 21/3065
(52) U.S. Cl. .......................... 438/706; 438/720; 252/79.1
(58) Field of Search .................... 438/706, 720; 252/79.1

(56) References Cited

U.S. PATENT DOCUMENTS 5,369,053  11/1994  Fang ..................................... 437/194

5,801,101 * 9/1998 Miyoshi ............................... 438/714

FOREIGN PATENT DOCUMENTS

0924753A2 * 6/1999 (EP) .

* cited by examiner

Primary Examiner—Benjamin L. Utech
Assistant Examiner—Lynette T. Umez-Eronini
(74) Attorney, Agent, or Firm—Jones Volentine, LLC

(57) ABSTRACT

A method for etching a metal film containing aluminum, using a hard mask, and a method for forming a line of a semiconductor device using the same, are provided. A metal film containing Al is formed on a semiconductor substrate. A hard mask pattern is formed on the metal film containing Al. Next, the metal film containing Al is etched using an etching gas, including a gas containing carbon, and using the hard mask pattern as the etching mask. Preferably, the hard mask pattern is formed of an oxide film or a nitride film in which case a capping layer for the etched metal layer is not needed.

15 Claims, 1 Drawing Sheet

METHOD FOR ETCHING METAL FILM CONTAINING ALUMINUM AND METHOD FOR FORMING INTERCONNECTION LINE OF SEMICONDUCTOR DEVICE USING THE SAME

BACKGROUND OF THE INVENTION

1. Field of the Invention

The present invention relates to a method for manufacturing a semiconductor device, and more particularly, to a method for etching a metal film containing aluminum using a hard mask, and a method for forming an interconnection line for a semiconductor device using the same.

2. Description of the Related Art

An interconnection line is a film material corresponding to the topmost film of a semiconductor device and it electrically connects devices after each device is completed. The main purposes of the interconnection line are either for connecting a PMOS or NMOS transistor to a bit line, or for connecting a cell to another cell. To manufacture a high-speed device, it is preferred that a low-resistivity material is used for an interconnection line. Thus, aluminum (Al), having the lowest resistivity among widely known materials, or its alloys (referred to as a "metal containing Al" hereinafter) are mainly used.

Since Al has excellent conductivity but is structurally weak at high temperatures, a protective film must be formed on the interconnection line formed of a metal containing Al, by a low pressure chemical vapor deposition (LP-CVD) method. Also, if the metal film containing Al is etched, the photoresist must be formed thickly, since the etching selectivity to photoresist is poor. Further, to allow high-speed operation of the semiconductor device, the metal film containing Al must be as thick as 5,000~8,000Å. Thus, in order to etch the metal line containing Al, a highly corrosive etchant must be used, i.e., one having a high etch rate. However, such an etchant is absorbed into the photoresist, causing corrosion in the metal line after etching.

Also, if the photoresist is formed thickly, the throughput is lowered and it is difficult to control the photoresist. Thus, a poor pattern profile is generated due to phenomena produced after the photolithography process, such as residue, notching or slope, and phenomena produced in the metal line after the etching process, such as thinning, bridging or variation in line widths. Particularly, when the semiconductor is highly integrated, the line width of the interconnection line must be reduced. However, it is impossible to reduce the line width of the metal line efficiently using the thick photoresist as in the conventional art.

In forming an interconnection line formed of a metal containing Al, using a photoresist, to avoid diffused reflection from the Al layer there is a widely known method forming the Al line by forming an anti-reflection film on the metal film containing Al by depositing titanium nitride (TiN) or titanium tungsten (TiW), and then forming a photoresist pattern on the anti-reflection film.

The photoresist used in the above-described process is as thick as 18,000~21,000 Å. However, in view of processing characteristics, the etching selectivity of the metal film containing Al to the photoresist does not exceed 3:1. Also, the profile of the photoresist pattern is not vertical, but is inclined to some extent. Further, since the photoresist at the edge of the Al film is much thinner than the other portions, the pattern of the metal film containing Al is thinned, and the margin of the photolithography is reduced.

To solve these problems, there has been proposed a process of injecting a hard material film (oxide group) which can serve as a buffer between the metal film containing Al and the photoresist film. However, this process also needs a photoresist film of 12,000~16,000 Åthick. Also, if the thickness of the metal film containing Al is greater than or equal to 6,000 Å, the process is not effective. Further, during this process, the metal film containing Al is etched when the photoresist exists. Thus, when etching the metal film containing Al, the photoresist must be removed simultaneously in the same machine, to minimize the corrosion caused by a strongly corrosive etchant. However, to this end, since a separate chamber for removing the photoresist must be installed in a chamber for etching the metal film containing Al, it is quite difficult to maintain and operate the facility.

SUMMARY OF THE INVENTION

To solve the above problems, it is an objective of the present invention to provide a method of etching a metal film containing Al without pattern corrosion by using a hard mask instead of photoresist.

It is a second objective of the present invention to provide a method of etching an Al containing metal film by which process margins and productivity can be improved.

It is a third objective of the present invention to provide a method for forming a line of a semiconductor device using the Al containing metal film etching method.

Accordingly, to achieve the above objectives of the present invention, first, a metal film containing Al is formed on a semiconductor substrate. A hard mask pattern is formed on the metal film containing Al. Next, the metal film containing Al is etched using an etching gas containing carbon, and using the hard mask pattern as the etching mask.

Preferably, the gas containing carbon is one selected from the group consisting of $CF_4$, $CHF_3$ and $CHCl_3$. Also, the gas containing carbon is preferably added at a flow rate of 10~20% of the overall flow rate of the etching gas.

The hard mask pattern may be formed of an oxide film or a nitride film. Also, the step of forming the hard mask pattern comprises the steps of forming a hard mask layer on the metal film containing Al, forming a photoresist pattern on the hard mask layer, patterning the hard mask layer using the photoresist pattern as a mask, and removing the photoresist pattern.

Also, the photoresist pattern is preferably formed to a thickness of 4,000~9,000 Å.

To accomplish another objective of the present invention, a metal layer is formed on a semiconductor substrate. A mask layer for patterning the metal layer is formed on the metal layer. Then, a photoresist pattern is formed on the mask layer. The mask layer is patterned using the photoresist pattern as an etching mask. Then, the photoresist pattern is removed, and the metal layer is patterned using an etching gas containing carbon and using the mask layer as an etching mask.

The gas containing carbon is one selected from the group consisting of $CF_4$, $CHF_3$ and $CHCl_3$. Also, the gas containing carbon is added at a flow rate of 10~20% of the overall flow rate of the etching gas.

The mask layer may be formed of an oxide film or a nitride film. Also, the photoresist pattern is preferably formed to a thickness of 4,000~9,000 Å.

Before the step of forming the metal layer, there is further provided the step of forming titanium (Ti) and titanium nitride (TiN) as a barrier layer on the semiconductor substrate to increase adhesion between the metal layer and the semiconductor substrate, and to prevent a metal of the metal layer from diffusing into the semiconductor substrate.

Also, before the step of forming the mask layer, a capping layer may be further formed on the metal layer, to prevent diffused reflection of light from the metal layer during the step of forming the photoresist pattern. The capping layer may be formed of TiN.

The metal layer is preferably formed of Al or an Al alloy.

According to the present invention, corrosion in the metal film pattern containing Al can be prevented by using gas containing carbon when etching the metal line containing Al using the hard mask. Also, the photoresist used in patterning the hard mask may be thin. Further, if the hard mask pattern is formed of a nitride film, then a separate anti-reflective film is not necessary, thereby simplifying the process.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
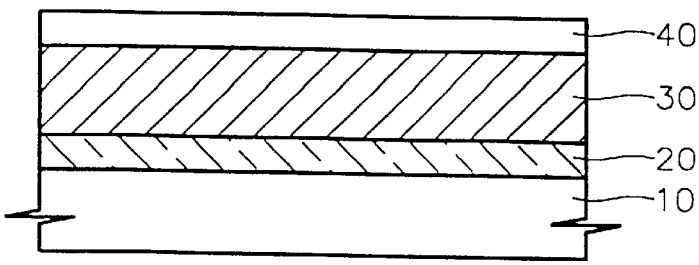
FIGS. 1 through 4 are sectional views illustrating a line forming method of a semiconductor device according to the present invention.

The present invention will be described in detail with reference to the accompanying drawings. The embodiment described below may be varied in various different ways, and the present invention is not limited thereto. Preferred embodiments are only provided to make the disclosure of the invention complete and to convey the concept of the invention to one having ordinary skill in the art. The thicknesses of various layers and regions are emphasized for clarity in the drawings, and the same reference numerals represent the same elements. Also, when a layer is said to exist on another layer or a substrate, the layer may exist directly on the other layer or substrate, or an interlayer film may be present therebetween.

The most difficult problems in forming a metal line are to achieve exact linewidth, to suppress undercutting caused by diffused reflection from a metal film, and to minimize the pattern corrosion by a corrosive etching gas. The present invention provides the solutions to these problems.

Referring to FIG. 1, titanium (Ti) and titanium nitride (TiN) are sequentially deposited on a semiconductor substrate 10 to form a barrier layer 20. The barrier layer 20 facilitates adhesion between the metal layer to be formed later and the semiconductor substrate 10, and prevents diffusion of a metal from the metal layer into the semiconductor substrate 10. A metal containing Al, such as Al or an Al alloy, is deposited on the barrier layer 20 to form a metal layer 30. Next, TiN is deposited on the metal layer 30 to form a capping layer 40. The reason for forming the capping layer 40 is to reduce diffused reflection of light from the metal layer 30 during a subsequent photolithography step.

Figure 2:
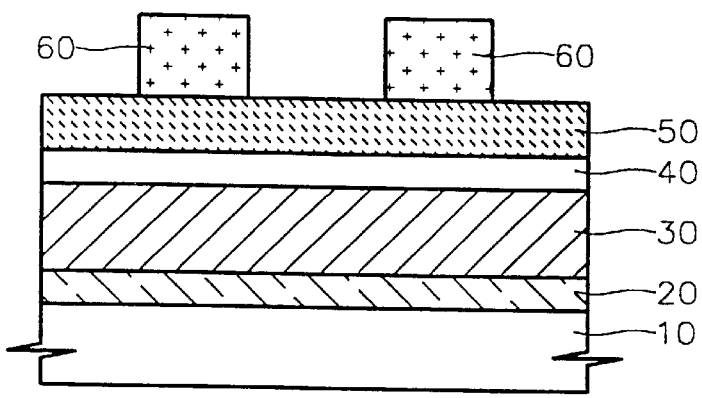

Referring to FIG. 2, an oxide or a nitride is deposited on the capping layer 40 by a plasma enhanced chemical vapor deposition (PECVD) method, thereby forming a hard mask layer 50 to be used as the mask for etching the metal layer 30. Subsequently, a photoresist pattern 60 is formed on the hard mask layer 50 by a photolithography process using photoresist.

The photoresist pattern 60 is formed to a thickness of 4,000~9,000 Å. Conventionally, for the purpose of patterning a metal layer, a thick photoresist pattern is formed to a thickness of 16,000~21,000 Å. In the present invention, however, the photoresist pattern 60 is formed to the minimum thickness capable of patterning the hard mask layer 50, e.g., 4,000 Å, thereby improving the margin of the photolithography process.

Figure 3:
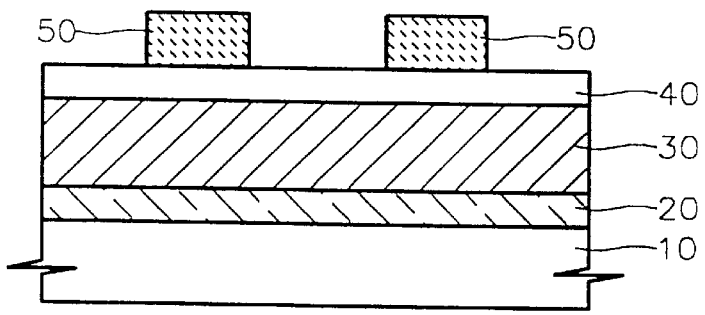

Referring to FIG. 3, the hard mask layer 50 is patterned using the photoresist pattern (60 of FIG. 2) as the etching mask. Next, the photoresist pattern is removed to leave the hard mask pattern 50 for patterning the metal layer 30.

Figure 4:
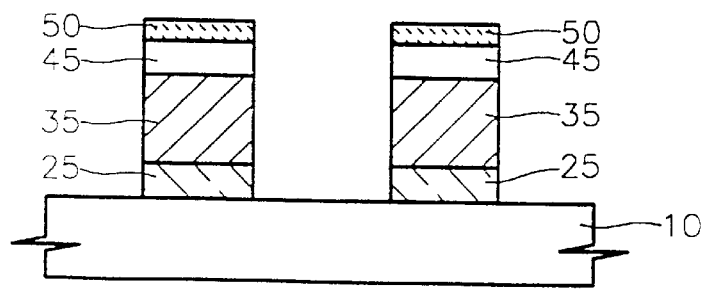

Referring to FIG. 4, the capping layer 40, the metal layer 30 and the barrier layer 20 are sequentially etched using the hard mask layer 50 as the etching mask, thereby forming a capping layer pattern 45, an interconnection line 35, and a barrier layer pattern 25. Since the metal layer 30, i.e., the metal film containing Al, is etched without photoresist, both sides of the interconnection line 35 are not passivated, and thus are at risk of undercutting. When the photoresist is used as the etching mask, the photoresist may overflow during the etching and protect the interconnection line 35 from diffused reflection of plasma. However, passivation by the photoresist does not occur in the case of using a hard mask. Thus, a method for obtaining a similar effect to passivation is required.

In the present invention, an etching gas combined with a gas containing carbon, e.g., $CF_4$, $CHF_3$ or $CHCl_3$, is used, and etching is performed under the following conditions.

Pressure (mT): 30~80

Power (W): 600~850

$BCl_3$ (sccm): 30~70

$Cl_2$ (sccm): 10~50

$N_2$ (sccm): below 40

$CF_4$ (sccm): 10~20

Magnetic flux density (G): 30~60

Temperature (°C): 50~80

When a gas containing carbon is not added to the etching gas, an undercut due to irregular reflection of Al is generated at both side walls of the interconnection line 35 formed by a metal containing Al. However, when a gas containing carbon is added to the etching gas, corrosion of the side walls of the interconnection line 35 is prevented by passivation caused by the gas containing carbon.

Additionally, it should be noted that the reflection index of a nitride film is 110% that of TiN. In other words, there is little difference in reflection index between the nitride film used as the hard mask layer (50 of FIG. 2) and TiN or TiW used as the capping layer (40 of FIG. 2). Thus, when using the nitride film as the etching mask when etching the metal film containing Al, the step of forming the capping layer can be omitted.

As described above, in a method for etching a metal film containing Al and a line forming method using the same, a hard mask pattern is formed on the metal film containing Al using a photoresist pattern, and then the metal film is etched using a gas containing carbon after removing the photoresist pattern. Therefore, the conventional problem, i.e., corrosion of the Al pattern which is caused by a low etching selectivity between the metal film containing Al and the photoresist film, can be solved. Further, if the hard mask pattern is formed of a nitride film, a separate anti-reflective film is not necessary, thereby simplifying the process.

Since the metal film is etched without photoresist, it is not necessary to provide extra equipment for removing the photoresist in an etching facility for the metal film containing Al, thereby improving the productivity.

Since the photoresist film is formed to the minimum thickness needed to pattern the hard mask layer, the margin of the photolithography process can be improved.

What is claimed is:

1. A method for etching a metal film containing aluminum (Al), comprising:

forming the metal film containing Al on a semiconductor substrate;

forming a hard mask pattern on the metal film containing Al using a photoresist pattern;

removing the photoresist pattern; and etching the metal film containing Al using a gas etchant which comprises a gas containing carbon using the hard mask pattern as an etching mask, wherein the gas etchant further comprises $BCl_3$, $Cl_2$ and $N_2$.

2. The method according to claim 1, wherein the gas containing carbon is one selected from the group consisting of $CF_4$, $CHF_3$ and $CHCl_3$.

3. The method according to claim 2, wherein the gas containing carbon is added at a flow rate of 10~20% of an overall flow rate of the etching gas.

4. The method according to claim 1, wherein the forming of a hard mask pattern comprises forming the hard mask pattern of an oxide film or a nitride film.

5. The method according to claim 4, wherein the forming of a hard mask pattern comprises forming an oxide film by plasma enhanced chemical vapor deposition (PE-CVD).

6. The method according to claim 1, wherein the forming of the hard mask pattern comprises forming the photoresist pattern to a thickness of 4,000~9,000 Å.

7. A method for forming an interconnection line of a semiconductor device, comprising:

forming a barrier layer on a semiconductor substrate:

forming a metal layer containing Al, which is to be patterned into the interconnection line, on the barrier layer;

forming a capping layer on the metal layer;

forming a mask layer, for patterning the metal layer, on the capping layer;

forming a photoresist pattern on the mask layer;

patterning the mask layer using the photoresist pattern as a mask to thereby form a mask pattern corresponding to that of the interconnection line to be formed;

removing the photoresist pattern; and etching the capping layer, the metal layer and the barrier layer using a gas etchant which comprises a gas containing carbon and using the patterned mask layer as an etching mask, wherein the gas etchant further comprises $BCl_3$, $Cl_2$ and $N_2$.

8. The method according to claim 7, wherein the gas containing carbon is one selected from the group consisting of $CF_4$, $CHF_3$ and $CHCl_3$.

9. The method according to claim 8, wherein the gas containing carbon is added at a flow rate of 10~20% of an overall flow rate of the etching gas.

10. The method according to claim 7, wherein the forming of a mask layer comprises forming the mask layer of an oxide film or a nitride film.

11. The method according to claim 10, wherein the forming of a mask layer comprises forming an oxide film by plasma enhanced chemical vapor deposition (PE-CVD).

12. The method according to claim 7, wherein the forming of the hard mask pattern comprises forming the photoresist pattern to a thickness of 4,000~9,000 Å.

13. The method according to claim 1, wherein the forming of a barrier layer comprises forming the barrier layer of titanium (Ti) and titanium nitride (TiN).

14. The method according to claim 1, wherein the forming of a capping layer comprises forming the capping layer of TiN.

15. The method according to claim 7, wherein the forming of a metal layer comprises forming the metal layer of Al or an Al alloy.

* * * * *